United States Patent
Huh et al.

(10) Patent No.: US 9,697,931 B2
(45) Date of Patent: Jul. 4, 2017

(54) METHOD OF PREPARING LARGE-AREA, THREE-DIMENSIONAL GRAPHENE TRANSPARENT ELECTRODE USING ELECTROSPRAY PROCESS AND LARGE-AREA, THREE-DIMENSIONAL GRAPHENE TRANSPARENT ELECTRODE PREPARED THEREFROM

(75) Inventors: Hoon Huh, Seoul (KR); Woo Sik Kim, Incheon (KR); Hui Jin Kim, Cheonan-si (KR); Eun Sung Yoo, Cheonan-si (KR); Suk Hoon Choi, Gwangju-si (KR); Ji Young Hwang, Ulsan (KR); Jee Young Jang, Bucheon-si (KR); Tae Il Kim, Gunpo-si (KR)

(73) Assignee: KOREA INSTITUTE OF INDUSTRIAL TECHNOLOGY, Cheonan-si (KR)

( * ) Notice: Subject to any disclaimer, the term of this patent is extended or adjusted under 35 U.S.C. 154(b) by 422 days.

(21) Appl. No.: 14/367,486

(22) PCT Filed: Aug. 6, 2012

(86) PCT No.: PCT/KR2012/006231
§ 371 (c)(1),
(2), (4) Date: Jul. 2, 2014

(87) PCT Pub. No.: WO2013/094840
PCT Pub. Date: Jun. 27, 2013

(65) Prior Publication Data
US 2015/0321215 A1    Nov. 12, 2015

(30) Foreign Application Priority Data

Dec. 22, 2011   (KR) .................. 10-2011-0139928
Apr. 30, 2012   (KR) .................. 10-2012-0045245

(51) Int. Cl.
*B05D 1/04* (2006.01)
*H01B 13/00* (2006.01)
(Continued)

(52) U.S. Cl.
CPC ........... *H01B 13/00* (2013.01); *B05B 5/1675* (2013.01); *B05D 1/04* (2013.01); *B05D 3/0272* (2013.01);
(Continued)

(58) Field of Classification Search
CPC ......... B05D 1/04; B05B 5/1675; B05B 5/005; B05B 5/1608; H01L 51/0037; H01B 1/04
See application file for complete search history.

(56) References Cited

U.S. PATENT DOCUMENTS

2009/0130607 A1*   5/2009   Slafer .............. H01J 37/32009
                                              430/323
2009/0266580 A1*  10/2009   Jung ..................... B82Y 10/00
                                              174/126.2
(Continued)

FOREIGN PATENT DOCUMENTS

JP    2010153793      7/2010
KR    1020100042345   4/2010
(Continued)

OTHER PUBLICATIONS

International Search Report—PCT/KR2012/006231 dated Feb. 21, 2013.
(Continued)

*Primary Examiner* — Xiao Zhao
(74) *Attorney, Agent, or Firm* — Cantor Colburn LLP

(57) ABSTRACT

Provided are a method of preparing a large-area, three-dimensional graphene transparent electrode using an electrospray deposition method and a large-area, three-dimensional graphene transparent electrode prepared therefrom.
(Continued)

More particularly, the present invention is related to a method of preparing a large-area, three-dimensional graphene transparent electrode using an electrospray deposition method, which may easily prepare a large-area graphene transparent electrode having high transparency and conductivity through an electrospray process and may obtain effects, which may not be realized in a two-dimensional transparent electrode prepared by a typical method such as CVD, due to a three-dimensional stack structure in which graphene is arranged perpendicular to a substrate, and a large-area, three-dimensional graphene transparent electrode prepared therefrom.

15 Claims, 10 Drawing Sheets

(51) Int. Cl.
  *B05D 3/02*    (2006.01)
  *C01B 31/04*    (2006.01)
  *H01B 1/04*    (2006.01)
  *B05B 5/16*    (2006.01)
  *B05B 5/00*    (2006.01)
  *H01L 51/00*    (2006.01)

(52) U.S. Cl.
  CPC ........... *C01B 31/0476* (2013.01); *H01B 1/04* (2013.01); *B05B 5/005* (2013.01); *B05B 5/1608* (2013.01); *H01L 51/0037* (2013.01)

(56) References Cited

U.S. PATENT DOCUMENTS

2010/0084007 A1* 4/2010 Jo .................... B82Y 10/00
                    136/252
2011/0133134 A1   6/2011   Varma et al.

FOREIGN PATENT DOCUMENTS

| KR | 1020100121978 | 11/2010 |
| KR | 1020110081519 | 7/2011 |
| KR | 1020110105408 | 9/2011 |
| KR | 1020110113936 | 10/2011 |

OTHER PUBLICATIONS

Jinkyu Han et al., Water-Soluble Polyelectrolyte-Grafted Multiwalled Carbon Nanotube Thin Films for Efficient Counter Electrode of Dye-Sensitized Solar Cells, ACS NANO, 2010, pp. 3503-3509.
Yu-Ming Lin et al., Strong Suppression of Electrical Noise in Bilayer Graphene Nanodevices, Nano Letters, 2008, pp. 2119-2125.
Jingwei Bai et al., Graphene nanomesh, Nature Nanotechnology, 2010, pp. 190-194.
Beom Joon Kim et al., High-Performance Flexible Graphene Field Effect Transistors with Ion Gel Gate Dielectrics, Nano Letters, 2010, pp. 3464-3466.
Shou-En Zhu et al., Graphene-Based Bimorph Microactuators, Nano Letters, 2011, pp. 977-981.
Thomas Mueller et al., Graphene photodetectors for high-speed optical communications, Nature Photonics, 2010, pp. 297-301.
Nikitas Papasimakis et al., Graphene in a photonic metamaterial, Optics Express, 2010, pp. 8353-8359.

* cited by examiner (a)          (b)

METHOD OF PREPARING LARGE-AREA, THREE-DIMENSIONAL GRAPHENE TRANSPARENT ELECTRODE USING ELECTROSPRAY PROCESS AND LARGE-AREA, THREE-DIMENSIONAL GRAPHENE TRANSPARENT ELECTRODE PREPARED THEREFROM

TECHNICAL FIELD

The present invention relates to a method of preparing a transparent electrode which may be easily applied to a large-area substrate while having a three-dimensional internal structure, in which graphene is arranged perpendicular to a substrate, as well as high transparency and electrical conductivity, and a transparent electrode prepared therefrom.

BACKGROUND ART

Graphene, as one of various carbon structures such as graphite, carbon nanotubes, and fullerene, is a two-dimensional structure that is composed of honeycomb structures in which carbon atoms are connected like a net.

Since graphene not only has high strength and high thermal conductivity but also has very good electrical conductivity and good elasticity, graphene may maintain electrical conductivity even in the case in which it is stretched or folded. Thus, graphene is being used in various application areas.

As one of typical application areas, graphene has a possibility of being used as an ultra high-speed transistor device through structural transformation to nanoribbon graphene, bilayer graphene, or nanomesh graphene due to its field-effect characteristics, and a study on a high-performance flexible transistor has recently been reported [Y-M Lin and Phaedon Avouris, "Strong Suppression of Electrical Noise in Bilayer Graphene Nanodevice," *Nano Lett.*, February 2008, pp. 2119-2125; Jingwei Bai, Xing Zhong, Shan Jiang, Yu Huang, and Xiangfeng Duan, "Graphene Nanomesh," *Nature Nanotech.*, February 2010, pp. 190-194; B. J. Kim, H. Jang, S. K. Lee, B. H. Hong, J. H. Ahn, and J. H. Cho, "High-Performance Flexible Graphene Field Effect Transistors with Ion Gel Gate Dielectrics?," *Nano Lett.*, 2010, pp. 3464-3466].

Also, electrical, mechanical, and thermal properties of graphene are applied to a biomimetic device to result in excellent characteristics in which the device has large displacement and fast response rate even at low power and the displacement also increases as the temperature increases [Shou-En Zhu et al., "Graphene-based Bimorph Microactuators," *Nano Lett.*, January 2011, pp. 977-981].

Korean Patent Application Laid-Open Publication No. 2011-0105408 discloses that a flexible resistance variable memory device using a graphene oxide is manufactured by the steps of forming a lower electrode layer on a substrate, forming a graphene oxide layer on the formed lower electrode, and forming an upper electrode layer on the formed graphene oxide layer.

In addition, Thomas Mueller et. al. have estimated that an ultra high-speed photodetector, which may operate at a wider wavelength range and may have a very fast response rate, may be realized using the properties of graphene [Thomas Mueller, Fengnian Xia, and Phaedon Avouris, "Graphene Photodetectors for High-Speed Optical Communications," Nature Photonics, March 2010, pp. 297-301].

Furthermore, results of measuring characteristics of graphene that is grown by chemical vapor deposition (CVD) and transferred on the surface of a metamaterial have recently been reported [Nikitas Papasimakis, Zhiqiang Luo, Ze Xiang Shen, Francesco De Angelis, Enzo Di Fabrizio, Andrey E. Nikolaenko, and Nikolay I. Zheludev, "Graphene in a Photonic Metamaterial," *Optics Express*, April 2010, pp. 8353-8359].

As described above, the application areas of graphene are very diverse according to various properties, and its potential applications are also very wide.

Thus, research into replacing transparent conductive oxides (TCOs), such as indium tin oxide (ITO) and zinc tin oxide (ZTO), which have been used as a transparent electrode, with graphene by using its advantages such as high transparency, high conductivity, high flexibility, and low manufacturing cost, has been continuously conducted.

Graphene has been prepared using chemical synthesis, CVD, and epitaxial synthesis, after it was first discovered through mechanical exfoliation (the so-called "Scotch tape method") by researchers in 2004.

Currently, highly crystalline graphene is prepared using mechanical cleavage of graphite, but it may have a low yield. Also, large-area monolayer graphene may be prepared by a method using the sublimation of SiC. However, it may have a low yield and coating (transferring) on another substrate may be difficult. Furthermore, when CVD is used, a large-area substrate may be coated with good-quality graphene, and thus, its applicability to a transparent conductive film (TCF) has increased. However, there is a need to overcome a limited area of the substrate.

Specifically, Japanese Patent Application Laid-Open Publication No. 22-153793 discloses a technique of horizontally stacking graphene by a CVD method, Korean Patent Application Laid-Open Publication No. 2011-0081519 discloses a graphene nanostructure prepared using a self-assembling material, and Korean Patent Application Laid-Open Publication No. 2010-121978 discloses a method of forming a graphene thin film by spray deposition of a graphene dispersion.

The graphene prepared by the above methods is stacked in a two-dimensional structure and does not have electrical conductivity in a vertical direction.

The graphene proposed in the above patents has a vertically stacked structure. However, since crystal planes of the graphene are horizontally deposited when the arrangement of the graphene is observed, it may be understood that the graphene itself is maintained in a two-dimensional structure.

According to electrical conduction properties of graphene, since electrons tend to move along the edges of the graphene, effects unexpected from a two-dimensional structure may be obtained when the graphene is formed in a three-dimensional structure instead of a two-dimensional structure.

As described above, a typical technique of applying graphene to a transparent electrode is widely known. However, a method of preparing a large-area graphene transparent electrode is still in a beginning stage. In Korean Patent Application Laid-Open Publication No. 2010-121978, a graphene thin film is prepared by spray deposition, but satisfiable, uniform thin film properties may be difficult to be obtained when the spay deposition is applied to prepare a large-area graphene thin film.

In relation to a technique of preparing a large-area thin film, there is an electrospray process in which a uniform thin film may be obtained by the deposition of droplets on a substrate. For example, Korean Patent Application Laid- Open Publication No. 2010-42345 discloses a method of fabricating an organic thin film, i.e., a patterned mask, through an electrospray process. However, it is difficult to find an example of applying an electrospray process to graphene so far.

DISCLOSURE OF THE INVENTION

Technical Problem

As a result of a significant amount of research conducted into developing a preparation method in which graphene is used as a transparent electrode wherein large-area graphene may be prepared and high transparency and conductivity may be secured, the present inventors proposed a method of forming a graphene thin film by electrospray, in which a conductive polymer is used together to further improve the conductivity and transparency as well as adhesion to a substrate.

The present invention provides a method of preparing a large-area transparent electrode having high transparency and high conductivity.

The present invention also provides a large-area, three-dimensional graphene transparent electrode prepared by the above method.

Technical Solution

According to an aspect of the present invention, there is provided a method of preparing a large-area, three-dimensional graphene transparent electrode including:

respectively preparing a substrate, a conductive polymer solution, and a graphene solution;

spraying the conductive polymer solution and the graphene solution on the substrate by an electrospray process using an electrospray apparatus including a nozzle; and drying.

According to another aspect of the present invention, there is provided a large-area, three-dimensional graphene transparent electrode prepared by the above method.

Advantageous Effects

A large-area graphene transparent electrode having high transparency and conductivity may be easily prepared through an electrospray process according to the present invention.

In particular, since a three-dimensional stack structure, in which graphene is arranged perpendicular to a substrate, is obtained by performing the electrospray process, effects, which may not be realized in a two-dimensional transparent electrode prepared by a typical method such as CVD, may be obtained.

MODE FOR CARRYING OUT THE INVENTION

Hereinafter, the present invention will be described in more detail.

In the present invention, a method of preparing a transparent electrode is proposed in which a large-area transparent electrode having high transparency and conductivity may be easily prepared. In particular, graphene is used as a material of the transparent electrode, and a transparent electrode having three-dimensional characteristics as well as typical two-dimensional electrical characteristics of graphene may be obtained by arranging graphene in a direction perpendicular to a substrate.

The transparent electrode may be prepared through an electrospray process and specifically, may be prepared by including the steps of:

respectively preparing a substrate, a conductive polymer solution, and a graphene solution;

spraying the conductive polymer solution and the graphene solution on the substrate by an electrospray process using an electrospray apparatus including a nozzle; and drying. Hereinafter, the preparation of the transparent electrode will be described in more detail.

Figure 1:
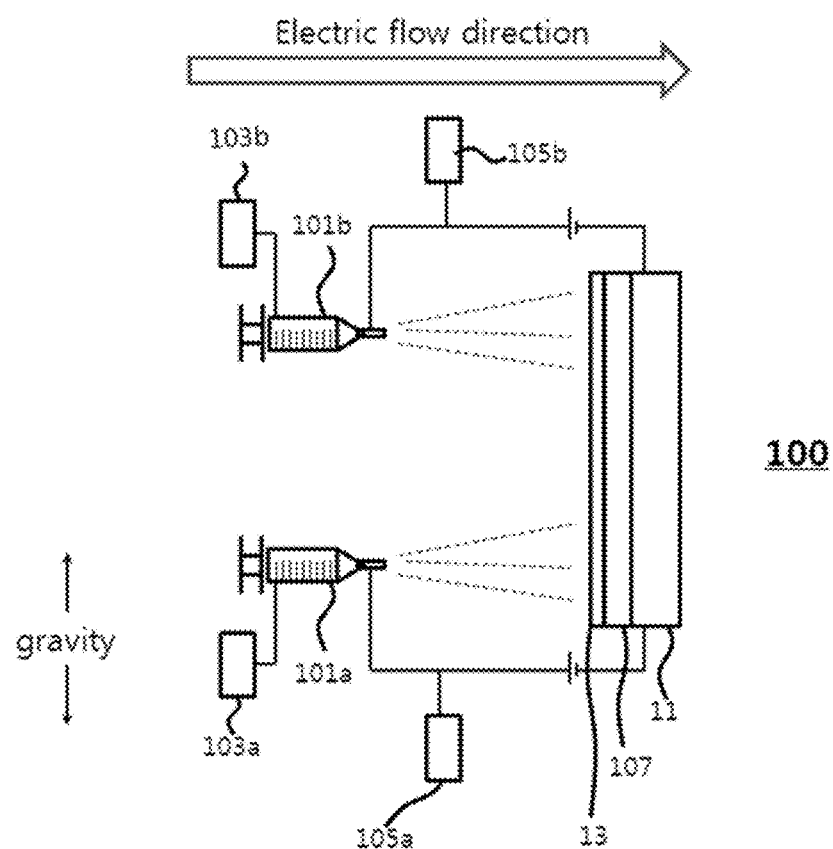
FIG. 1 is a schematic view illustrating an electrospray apparatus used in the present invention.

FIG. 1 is a schematic view illustrating an electrospray apparatus used in the present invention. In the present invention, the electrospray apparatus is not particularly limited, and the apparatus quipped with two nozzles as illustrated in FIG. 1 may be used. In this case, the electrospray apparatus may be variously modified by the person skilled in the art, the electrospray apparatus is exaggerated for clarity of illustration, and a known device or configuration necessary for electrospray may be further added to each element of the electrospray apparatus. For convenience of understanding, two syringes, two pumps, and two potential generators are respectively illustrated for the spray of the conductive polymer solution and the graphene solution. However, according to a solution used or electrical connection method, one or plurality of the above elements may be included. That is, the number of syringes and pumps included may be changed according to the number of solutions used, and the syringe and pump may be used by being electrically connected to a single potential generator.

In particular, in order to exclude the effect of gravity, the nozzle and the substrate are respectively disposed so as to be horizontal and perpendicular to the direction of gravity.

Referring to FIG. 1, an electrospray apparatus 100 may include syringes 101a and 101b each including a nozzle in which a conductive polymer solution and a graphene solution are respectively stored for electrospraying, syringe pumps 103a and 103b for supplying the conductive polymer solution and the graphene solution to the syringes 101a and 101b, potential generators 105a and 105b for forming electric fields between a substrate 11 and the syringes 101a and 101b, and a stage 107 for supporting the substrate 11 on which the conductive polymer solution and the graphene solution are deposited.

The method of preparing a three-dimensional graphene transparent electrode using the electrospray apparatus 100 will be described in more detail.

First, the substrate 11 is disposed in the electrospray apparatus 100.

In the present invention, the substrate 11 is not particularly limited, and any substrate (silicon substrate, glass substrate, or polymer substrate) may be used as long as it is a material typically used as a substrate. For example, glass substrates formed of alkaline silicate-based glass, alkali-free glass, and quartz glass, silicon substrates formed of single silicon (Si) and p-Si, resin substrates formed of acrylate, polycarbonate, and polyethylene naphthalate (PEN), and polymer substrates formed of polyethylene terephthalate (PET) and polyamide may be used. For example, a polymer is used and a roll-to-roll process may be used to prepare the substrate 11.

Specifically, the method of using a roll-to-roll process denotes a method of preparing a transparent electrode through an electrospray process while transferring a flexible substrate sheet, such as a PET sheet, by rollers. That is, processes of providing a flexible substrate sheet to a feeder, spraying conductive polymer and graphene while the flexible substrate sheet passes through a chamber, in which electrospray is performed, by rollers, and drying the substrate while subsequently passing through a furnace are sequentially performed.

The substrate 11 may have a thickness within a typical range. For example, the thickness of the substrate 11 is in a range of 0.1 mm to 10 mm and may be in a range of 0.3 mm to 5 mm.

According to the application areas of the three-dimensional graphene transparent electrode, the substrate 11 may be used as it is, or may be used in various devices by removing only the substrate 11, if necessary.

The substrate 11 may be pretreated with plasma to facilitate the deposition of the graphene and conductive polymer before the electrospray.

Next, a conductive polymer solution and a graphene solution are respectively prepared, and the solutions are respectively injected into the syringes 101a and 101b using the syringe pumps 103a and 103b. In this case, nozzles of the syringes 101a and 101b are disposed so as to be perpendicular to the substrate 11.

Since the conductive polymer itself has transparency as well as conductivity, the conductive polymer may be used as an electrode material. In addition, the conductive polymer is used for fixing and supporting graphene in order for the graphene to be maintained in a state of being arranged in a vertical direction and to be well attached to the substrate 11.

A polymer having conductivity, such as polyaniline, polypyrrole, polyacetylene, polythiophene, and poly(3,4-ethylenedioxythiophene) (PEDOT), may be used as the conductive polymer. PEDOT was used in an embodiment of the present invention.

Also, a preparation method of the graphene used is not particularly limited, and graphene may be directly prepared or commercial graphene in the form of a flake may be directly purchased and used. For example, in the present embodiment, graphene having a width of 2 μm to 3 μm was directly prepared by a chemical exfoliation method and used.

A solvent usable in the conductive polymer solution and the graphene solution may be variously selected by the person skilled in the art as long as it may sufficiently dissolve or disperse the conductive polymer solution and the graphene solution. Typical examples of the solvent may be water, methanol, ethanol, propanol, isopropanol, butanol, ethyl acetate, butyl acetate, diethylene glycol dimethyl ether, diethylene glycol dimethyl ethyl ether, methyl methoxypropionate, ethyl ethoxypropionate (EEP), ethyl lactate, propylene glycol methyl ether acetate (PGMEA), propylene glycol methyl ether, propylene glycol propyl ether, methyl cellosolve acetate, ethyl cellosolve acetate, diethylene glycol methyl acetate, diethylene glycol ethyl acetate, acetone, methyl ethyl ketone, methyl isobutyl ketone, cyclohexanone, dimethylformamide (DMF), N,N-dimethylacetamide (DMAc), N-methyl-2-pyrrolidone (NMP), γ-butyrolactone, diethyl ether, ethylene glycol dimethyl ether, diglyme, tetrahydrofuran (THF), methyl cello solve, ethyl cellosolve, diethyl ether, diethylene glycol methyl ether, diethylene glycol ethyl ether, dipropylene glycol methyl ether, toluene, xylene, hexane, heptane, and octane. The above materials may be used alone or in a mixture thereof. In the present invention, dimethylformamide was used.

An amount of the solvent used may be in a range of 1 mL to 1,000 mL as a volume ratio based on 1 g of the conductive polymer or graphene. In this case, the amount of the solvent is controlled to obtain a concentration at which the nozzle is not clogged during the electrospray. That is, in the case that the concentration is excessively high, the electrospray is not facilitated. In contrast, in the case in which the concentration is excessively low, electrospray time may be increased to increase total processing time. Also, since the thickness of each layer may be changed according to the concentration of each solution, the process is performed by determining the optimum concentration in consideration of flow rate and time to be described below.

Specifically, a concentration of the graphene solution may be in a range of 0.001 g/mL to 0.1 g/mL. When the concentration is less than the above range, electrical conductivity may decrease during the deposition on the substrate. In contrast, when the concentration is greater than the above range, dispersion may be difficult so that a uniform thin film may not be formed and the transparency of the transparent electrode may be reduced.

Also, a concentration of the conductive polymer solution may be in a range of 0.001 g/mL to 1.0 g/mL. When the concentration is less than the above range, graphene may not be effectively fixed to the substrate. In contrast, when the concentration is greater than the above range, a uniform thin film may be difficult to be formed due to the increase in viscosity.

In particular, in order for the transparent electrode to satisfy both transparency and electrical conductivity, there is a need to control a content ratio of the graphene and the conductive polymer. For example, a weight ratio of graphene:conductive polymer may be in a range of 1:0.1 to 1:50. When the amount of the graphene is less than the above range, the electrical conductivity may be too low to be used as the electrode. In contrast, when the amount of the graphene is greater than the above range, adhesion to the substrate may be reduced. Thus, the graphene may be appropriately used within the above range.

If necessary, the conductive polymer and graphene solutions may include an additive such as a dispersant for increasing dispersion stability, a surfactant and a plasticizer for forming droplets during the electrospray, a thickener, and a diluent. That is, the conductive polymer and graphene solutions used in the electrospray must have high dispersion stability so as to be maintained without precipitation and aggregation or agglomeration over a prolonged period of time, and may form stable droplets without clogging of the nozzle during the electrospray. For such characteristics, each component constituting the solutions must be selected and the amount range thereof must be limited. If necessary, with respect to the graphene solution, ultrasonic waves are applied to allow the solution to be maintained in a uniformly dispersed state without precipitation.

Next, electricity is applied to the nozzle and the stage 107 using the potential generator 105a to form an electric field flowing in a vertical direction in the chamber.

Since the graphene 15 has electrical characteristics in which electrons are transferred along edges, orientation of the graphene may be controlled when the graphene 15 is stacked on the substrate 11 by the flow of electric field that is applied during the electrospray process.

Figure 2:
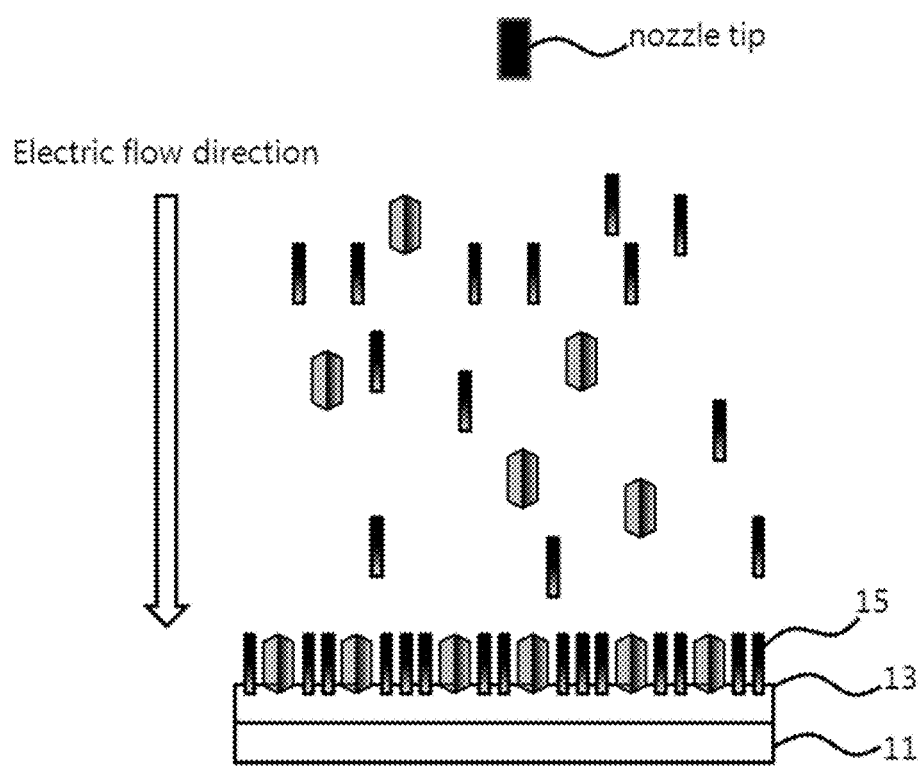
FIG. 2 is a schematic view illustrating a method of preparing a three-dimensional graphene structure according to the present invention.
Figure 3:
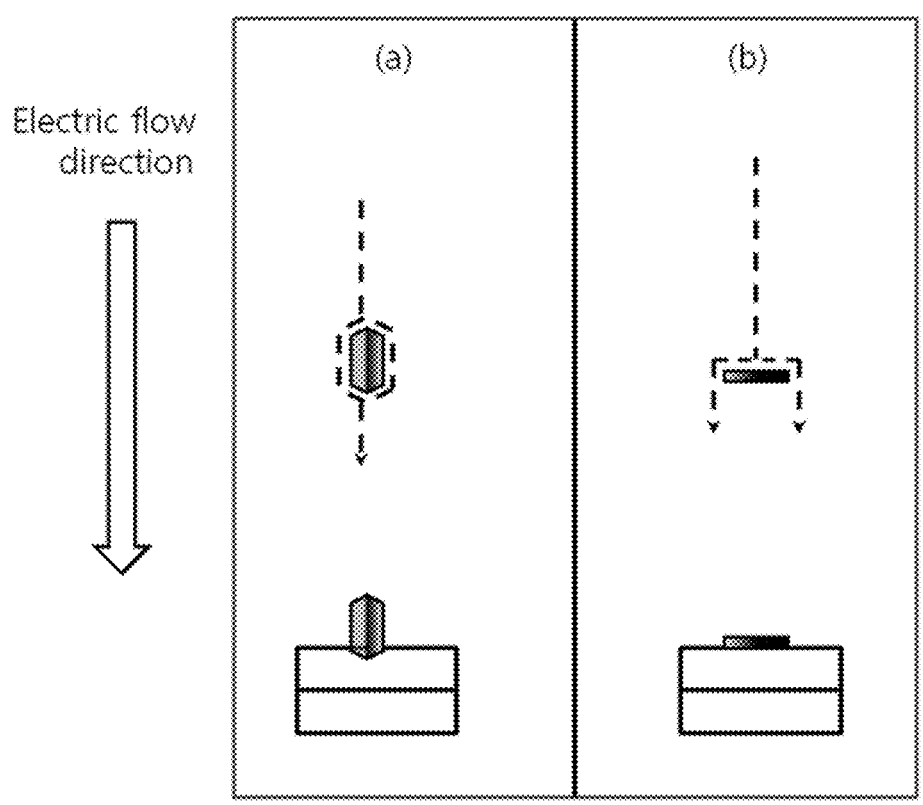
FIG. 3 illustrates the orientation of graphene during an electrospray process in which (a) represents a movement in a vertical direction, and (b) represents a movement in a horizontal direction.

FIG. 2 is a schematic view illustrating a method of preparing a three-dimensional graphene transparent electrode according to the present invention, and FIG. 3 illustrates the orientation of graphene during an electrospray process in which (a) represents a movement in a vertical direction, and (b) represents stacking in a horizontal direction.

Referring to FIG. 2, a nozzle tip spraying the graphene solution and the substrate 11 are perpendicular to each other and an electric field is applied thereto to control the flow of electric field to be in a vertical direction. The graphene 15 sprayed from the nozzle tip is transferred to the substrate 11 in a direction perpendicular to a crystal plane of the graphene 15 according to the flow of electric field as illustrated in (a) of FIG. 3. In this case, according to the characteristics of graphene, since the flow or transfer of the graphene in a horizontal direction as illustrated in (b) of FIG. 3 does not occur, the alignment of the graphene 15 in the vertical direction may be possible. However, in a typical spray deposition process in which an electric field is not formed, the flow as in (b) of FIG. 3 may be possible, and as a result, the graphene 15 may be stacked in the horizontal direction as in (b) of FIG. 3.

In this case, for the effective arrangement of the graphene 15 in the vertical direction, the substrate 11 is disposed on a lower side and the nozzle is disposed on an upper side so as to allow the graphene 15 to be effectively transferred to the substrate 11 by the gravity as well as the electric field. Also, it may be desirable to exclude other factors that obstruct the stacking of the graphene 15 in addition to the electric field. For example, as illustrated in FIG. 1, the nozzle is disposed parallel to the direction of gravity in order to exclude the effect of gravity, and the substrate 11 is disposed perpendicular to the direction of gravity.

In addition, since the graphene 15 is transferred by the electrospray in the present invention, the graphene 15 may be also easily and effectively applied to the large-area substrate 11. Thus, the present invention may improve the ease of processing and applicability.

Next, a transparent electrode layer 13 is formed by injecting droplets of the conductive polymer solution and the graphene solution from the syringe 101a into the substrate 11.

Figure 4:
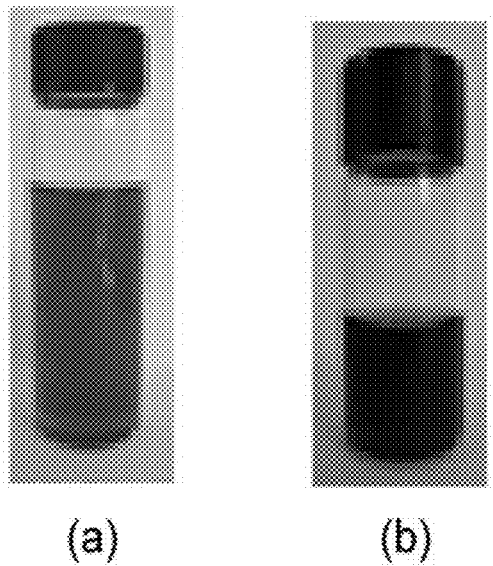
FIG. 4 is images of solutions in which (a) graphene oxide and (b) reduced graphene oxide are respectively dispersed in water and dimethylformamide (DMF)

The electrospray process of the conductive polymer solution and the graphene solution in the form of a separate or mixed solution is performed by a simultaneous injection, separate injection, or gradient injection process. For convenience, the separate injection process is illustrated in FIGS. 2 to 4.

When the simultaneous injection is performed, the graphene and conductive polymer are mixed together to form a transparent electrode thin film. When the separate injection is performed, the conductive solution is electrosprayed for a predetermined period of time and then the graphene solution is sequentially electrosprayed. Also, the gradient injection process is performed in such a manner that the conductive polymer solution is sprayed, the graphene solution is sprayed together, and the graphene solution is then sprayed alone.

The above injection processes may be selected by the person skilled in the art in consideration of various parameters such as an apparatus, process conditions, duration, characteristics of a transparent electrode, and purpose of application. For example, with respect to the simultaneous injection process, processing time may be reduced, and with respect to the separate injection, the adhesion of graphene to the substrate and electrical properties may be improved. With respect to the gradient injection, since the above-described advantages may not only be obtained but also there may be almost no interface between the conductive polymer layer and the graphene layer, a transparent electrode having excellent electrical and optical properties as well as overall uniformity may be prepared.

When examining factors during the electrospray process, a distance between the nozzle and the substrate and the strength of a magnetic field applied in this case must be importantly considered so as to allow the graphene injected from the nozzle to be transferred in a vertical orientation.

Specifically, in the case that the distance between the nozzle and the substrate is insufficient, graphene may not sufficiently have the vertical orientation, and in the case in which the distance is excessively long, preparation time may increase. Thus, the distance between the nozzle and the substrate may be controlled to be in a range of 1 cm to 15 cm.

In this case, the nozzle may be selected in consideration of the type of the solution used, the size of the substrate, and the processing time, and one to five nozzles may be used.

For example, the conductive polymer solution and the graphene solution may be mixed and one nozzle may be used. The conductive polymer solution and the graphene solution may be separately prepared and two or more nozzles may be separately used. Also, when a different type of the conductive polymer solution is used, a separate nozzle may be used. The number of nozzles may be increased as the size of the substrate increases, and the plurality of nozzles may be used to reduce the processing time. For example, in the present embodiment, one nozzle was used when a substrate having a size of 10×10 cm$^2$ was deposited, and five nozzles were used when a substrate having a size of 50×50 cm$^2$ was deposited.

Also, electricity is applied to spray in the form of droplets, wherein there is a tendency that smaller droplets may be formed as a voltage of the electricity applied in this case increases. Therefore, in order for single graphene to be included in a single droplet for the uniform arrangement of the graphene, that is, in order to form micron-sized droplets, the voltage is applied in a range of 5 kV to 50 kV, for example, 10 kV to 25 kV.

In addition, in the case that the distance between the nozzle and the substrate is long, a high voltage may be applied, and in the case in which the distance is short, a low voltage may be applied. It may be desirable to appropriately consider the amount of the voltage in addition to the distance between the nozzle and the substrate. In experimental examples of the present invention, the voltage applied between the nozzle and the substrate was 20 kV.

Also, as a parameter during the electrospray, flow rates of the conductive polymer solution and the graphene solution may be considered for controlling the thickness of the transparent electrode. That is, the amounts of the conductive polymer and graphene applied may be increased as the flow rate of each solution increases, and as a result, the thickness of each layer may increase. For example, the flow rate of each solution may be in a range of 0.001 mL/min to 10 mL/min. According to an embodiment of the present invention, an about 6 µm thick graphene thin film was obtained by depositing at a flow rate of 0.01 mL/min for 5 minutes.

In addition to the flow rate, a parameter related to the thickness of the transparent electrode may be a processing time. Since the thickness of the transparent electrode is increased as the processing time increases, the thickness of the transparent electrode may be easily adjusted by controlling the processing time. For example, the three-dimensional graphene transparent electrode according to the present invention may have a thickness in a range of 1 µm to 20 µm.

Next, the solvent or various additives included in the conductive polymer solution and the graphene solution may be removed by a drying process to form a graphene transparent electrode having a three-dimensional structure on the substrate 11.

In this case, drying conditions may be changed according to the solvent used, and the drying may be performed in a temperature range of 15° C. to 200° C. so as to sufficiently remove the solvent.

Furthermore, in the method according to the present invention, the electrospray process not only has advantages in terms of costs in comparison to a typical process using an expensive apparatus for deposition, but also may reduce preparation time and may be performed at room temperature and atmospheric pressure. Thus, the method may be suitable for a mass production process.

The three-dimensional graphene structure having the above-described structure according to the present invention is prepared through an electrospray process, in which deposition in the form of droplets may be possible by an electric field, instead of typical chemical vapor deposition (CVD) or a simple spray deposition process.

Since the transparent electrode prepared by the above method has a three-dimensional structure in which graphene is vertically arranged, the transparent electrode has better electrical properties than a graphene thin film exhibiting two-dimensional flow of electricity which is prepared by a typical CVD method.

Also, the prepared transparent electrode has an optical transmittance of 80% or more at 550 nm and a sheet resistance of 1,100 $\Omega/cm^2$ or less. Thus, the prepared transparent electrode may be suitable for a transparent electrode. The transmittance and the sheet resistance may be easily controlled by adjusting the amount of the graphene in the preparation process, and production of the transparent electrode may be possible to meet the specification range of a product to which the transparent electrode aims at being applied.

As described above, optical and electrical properties of the transparent electrode may be easily controlled by adjusting the concentration of graphene or varying the type and concentration of the conductive polymer and changing the spray method. Also, since a transparent electrode having uniform thin film characteristics may be prepared on a large-area substrate through electrospray and the process may be performed at room temperature and atmospheric pressure, there may be an advantage of reducing processing costs in comparison to a method such as CVD.

EXAMPLES

Hereinafter, the present invention will be described according to examples and experimental examples. However, the following examples are merely presented to exemplify the present invention, and the present invention is not limited thereto.

Example 1: Preparation of Three-Dimensional Graphene Transparent Electrode by Simultaneous Injection (1) Graphene Preparation Graphene oxide (GO) was prepared using graphite powder by a modified Hummers and Offeman method [1. W. S. Hummers, R. E. Offeman, *J. Am. Chem. Soc.* 1958, 80, 1339].

For the exfoliation of graphite, 10 mL of sulfuric acid was mixed with 50 mL of distilled water for 3 hours in a water tank at 35±5° C. Next, 1 g of graphite, 10 mL of potassium hydroxide, and dilute sulfuric acid were stirred in an ice bath for 3 hours using a magnet coated with Teflon to prepare a thick paste. 100 mL of distilled water was added while the color of the graphite mixed solution was changed from black to dark brown. Thereafter, 10 mL of hydrogen peroxide as an oxidant was slowly added to prepare graphene oxide, and in this case, the color of the solution was changed from dark brown to yellow.

The solution thus obtained was separated at 15,000 rpm for 30 minutes in a high-speed centrifuge to recover graphene oxide. The graphene oxide was washed with 200 mL of 5% hydrochloric acid, and was then repeatedly washed with distilled water until a pH value of the washing solution became 7.

The graphene oxide thus obtained was dispersed in DMF and then subjected to a reduction treatment at 90° C. for 24 hours to obtain reduced graphene oxide (RGO) that is dispersed in a DMF solvent. The RGO exhibited a stable dispersed state for 4 weeks at room temperature. Samples were prepared during the above period and properties were evaluated.

Evaluation

FIG. 4 is images of solutions in which (a) graphene oxide and (b) reduced graphene oxide are respectively dispersed in water and DMF. The graphene oxide dispersion of (a) of FIG. 4 showed a light brown color and the reduced graphene oxide dispersion of (b) of FIG. 4 changed to a black color. According to the above color changes, it may be understood that the reduction process was appropriately performed. Both of the dispersions exhibited a stable dispersed state at room temperature.

Figure 5:
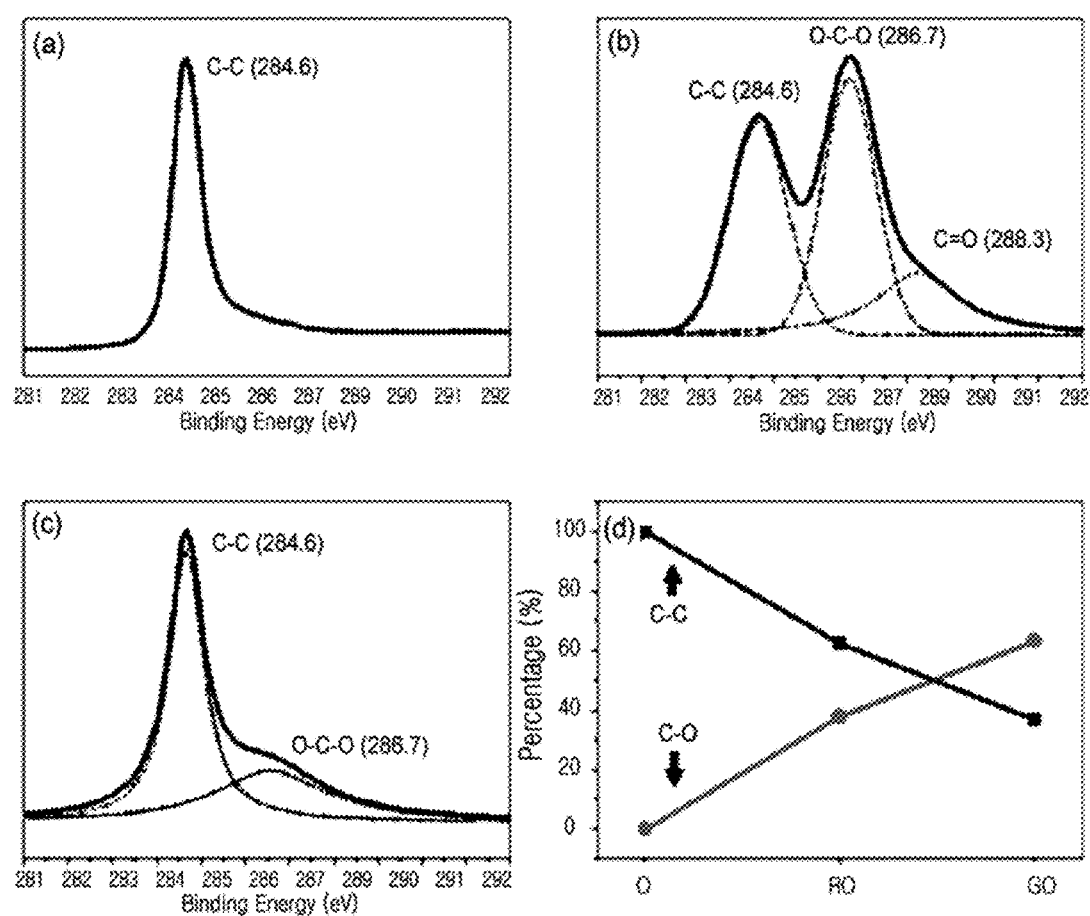
FIG. 5 illustrates Kα X-ray photoelectron spectrums of graphite, graphene oxide, and reduced graphene oxide which are used as raw materials.

FIG. 5 illustrates results of analyzing graphite, graphene oxide, and reduced graphene oxide, which are used as raw materials, with a Kα X-ray photoelectron spectroscopy (Thermo Fisher Scientific Co., Ltd.). Specifically, FIG. 5 illustrates spectrums of (a) graphite, (b) graphene oxide, and (c) reduced graphene oxide measured by X-ray photoelectron spectroscopy (XPS), and (d) of FIG. 5 is a graph comparing peak area ratios of these spectrums. Referring to FIG. 5, according to the changes in the binding energies of C—C and C—O, it may be understood that an oxidation process from (a) graphite to (b) graphene oxide and a reduction process to (c) reduced graphene oxide were appropriately performed.

Figure 6:
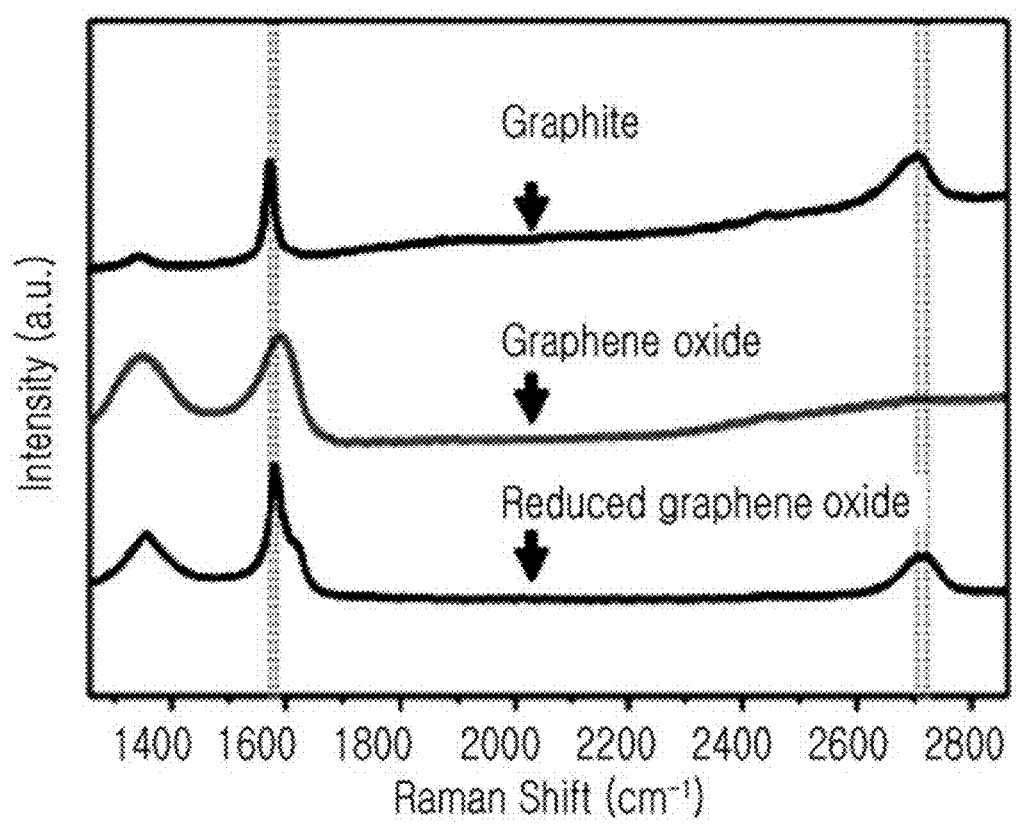
FIG. 6 illustrates Raman spectrums of graphite, graphene oxide, and reduced graphene oxide which are used as raw materials.

FIG. 6 illustrates results of analyzing graphite, graphene oxide, and reduced graphene oxide, which are used as raw materials, with a Raman spectrometer (a LabRam HR (Jobin-Yvon), Ar-lazer, 514.5 nm). Referring to FIG. 6, three Raman bands, i.e., 1,355 $cm^{-1}$ (D-band), 1,585 $cm^{-1}$ (G-band), and 2,700 $cm^{-1}$ ($2^{nd}$ order band), were observed.

Structural changes from the graphite to the graphene oxide and the reduced graphene oxide may be obtained by the calculation of a Raman intensity ratio ($I_D/I_G$) of D-band to G-band, and each $I_D/I_G$ calculated was 0.15, 0.86, and 0.59. Thus, it may be confirmed that the oxidation and reduction process of the graphite were appropriately performed.

Also, a thickness of the reduced graphene oxide prepared may be predicted by comparing a peak position of 2-D band and an intensity ratio of 2-D band to G-band. Specifically, according to the change from graphite to a graphene structure, the position of the 2D-band was moved from 2,711 $cm^{-1}$ to 2,704 $cm^{-1}$, and the $I_{2D}/I_G$ ratio was increased from 0.6 to 0.82. Thus, it may be confirmed that the thickness was decreased while the graphite was exfoliated to form graphene.

Figure 7:
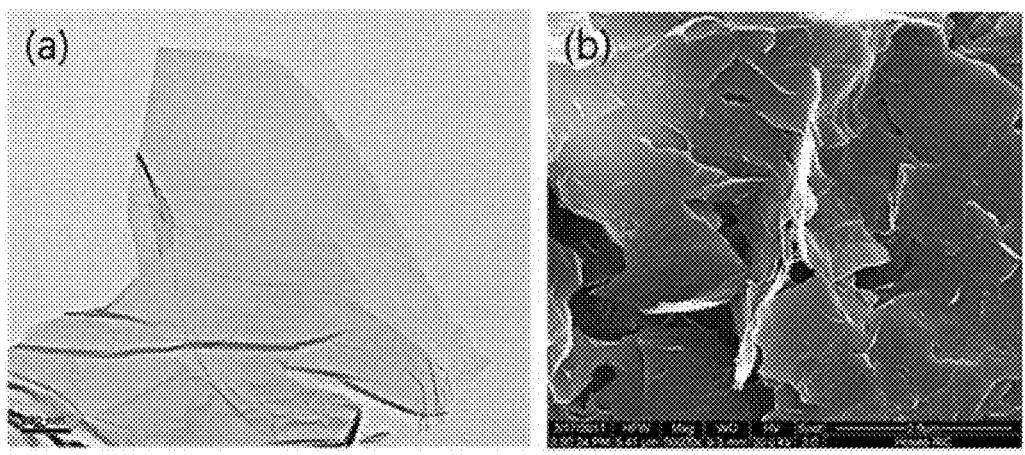
FIG. 7 is high-resolution transmission electron microscope (HRTEM) images of reduced graphene oxide prepared.

FIG. 7 is high-resolution transmission electron microscope (HRTEM) images of the reduced graphene oxide prepared, and according to the images of (a) and (b), it may be understood that corners were composed of a single layer and had an unfolded form. Also, it may be understood that the width thereof was in a range of 2 microns to 3 microns.

(2) Preparation of Transparent Electrode Using Electrospray 0.001 g of the graphene prepared in (1) was dispersed in 1 ml of DMF to prepare a graphene solution. Also, 1 g of PEDOT was dissolved in 5 ml of DMF to prepare a conductive polymer solution.

The graphene solution and the PEDOT solution were respectively injected into syringes of an electrospray apparatus. A glass wafer having a size of 40×50 $cm^2$ was used as a substrate, and a distance between a needle of the syringe and the substrate was controlled to be 10 cm. An electric field of 20 kV was applied between the needle and the substrate to perform a deposition process.

The PEDOT solution and the graphene solution were simultaneously electrosprayed through the nozzles to deposit a thin film having a thickness of 6 μm on the substrate. Then, the thin film was dried at 100° C. for 1 hour to prepare a three-dimensional graphene transparent electrode.

Example 2: Preparation of Three-Dimensional Graphene Transparent Electrode by Simultaneous Injection A three-dimensional graphene transparent electrode was prepared in the same manner as in Example 1 except that a graphene solution having a concentration of 0.002 g/mL was used.

Example 3: Preparation of Three-Dimensional Graphene Transparent Electrode by Simultaneous Injection A three-dimensional graphene transparent electrode was prepared in the same manner as in Example 1 except that a graphene solution having a concentration of 0.004 g/mL was used.

Comparative Example 1: Preparation of Graphene Transparent Electrode by Spray Deposition A graphene transparent electrode having a thickness of 10 μm was obtained using a simple spray deposition method proposed in Korean Patent Application Laid-Open Publication No. 2010-0121978. In this case, the spraying was performed using the graphene solution and the PEDOT solution which were used in Example 1.

Comparative Example 2: Preparation of Graphene Transparent Electrode by Spray Deposition A graphene transparent electrode was prepared in the same manner as in Comparative Example 1 except that 0.002 g of graphene was used.

Comparative Example 3: Preparation of Graphene Transparent Electrode by Spray Deposition A graphene transparent electrode was prepared in the same manner as in Comparative Example 1 except that 0.004 g of graphene was used.

Comparative Example 4: Preparation of PEDOT Thin Film by Electrospray Deposition A PEDOT thin film was prepared in the same manner as in Example 1 except that PEDOT was used alone.

Comparative Example 5: Preparation of PEDOT Thin Film by Spray Deposition

A PEDOT thin film was prepared in the same manner as in Comparative Example 1 except that PEDOT was used alone.

Comparative Example 6: Preparation of Graphene Transparent Electrode by CVD

A substrate was deposited with graphene using a chemical vapor deposition method.

Figure 8:
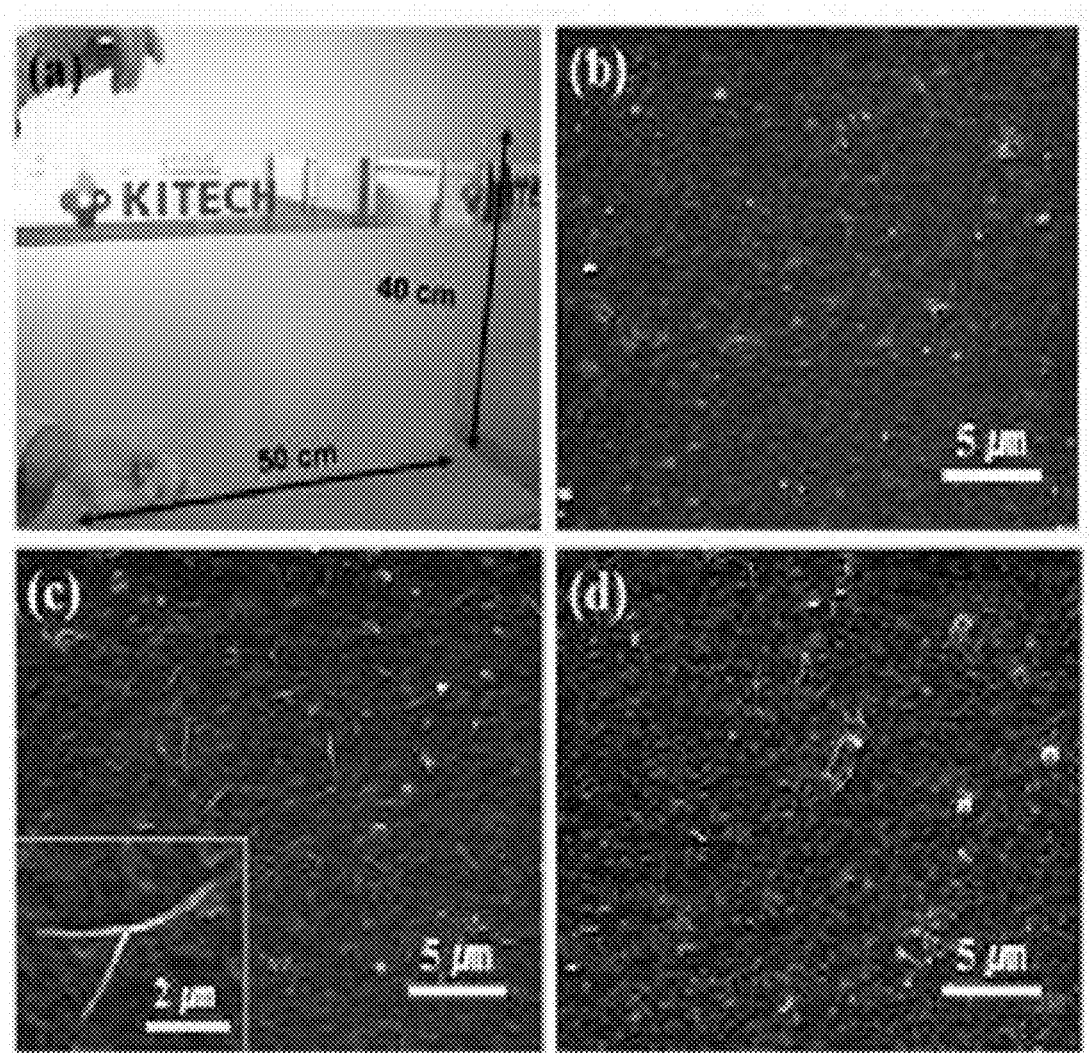
FIG. 8 illustrates (a) an image of a substrate, and transmission electron microscope images of (b) a graphene transparent electrode prepared in Example 1, (c) a graphene transparent electrode prepared in Example 2, and (d) a graphene transparent electrode prepared in Example 3.

<Experimental Example 1> Analysis of Three-Dimensional Graphene Transparent Electrode (1) Transmission Electron Microscopic Analysis FIG. 8 illustrates (a) an image of a substrate and transmission electron microscope images of (b) the graphene transparent electrode prepared in Example 1, (c) the graphene transparent electrode prepared in Example 2, and (d) the graphene transparent electrode prepared in Example 3.

Referring to (b) to (d) of FIG. 8, graphene and PEDOT were uniformly deposited on the substrates to form thin films, and it may be understood that uniform thin films were formed even in the case in which the amount of graphene was increased.

Figure 9:
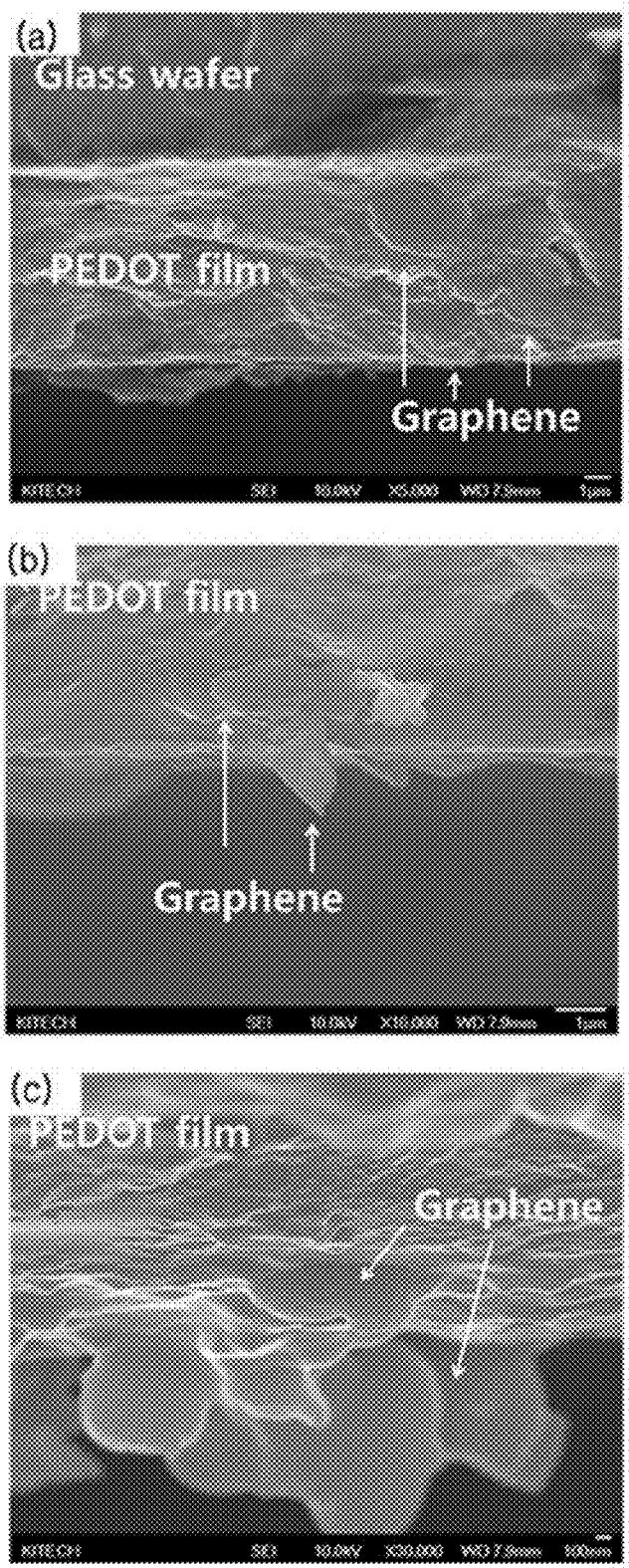
FIG. 9 illustrates scanning electron microscope images of a three-dimensional graphene transparent electrode prepared in Example 3, in which (a) represents a front view and (b) to (d) represent cross sectional views.

(2) Field-Emission Scanning Electron Microscopic (FE-SEM, Quanta 200 FEG, FEI) Analysis FIG. 9 illustrates scanning electron microscope images of the three-dimensional graphene transparent electrode prepared in Example 3, in which (a) represents a front view and (b) to (d) represent cross sectional views. Referring to (a) of FIG. 9, as a result of the observation of the three-dimensional transparent electrode from the front, a sharp white area was observed, and the white area denotes an edge when the graphene is viewed vertically. Referring to (b) to (d) of FIG. 9, it may be understood that graphene was vertically arranged at a predetermined angle.

This may be clearly compared with graphene prepared by a typical CVD or air spray method.

Figure 10:
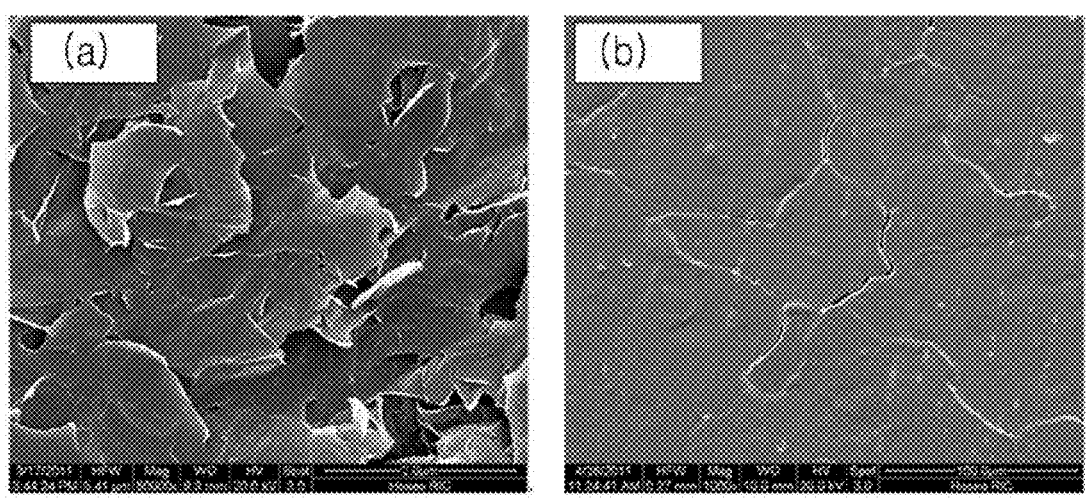
FIG. 10 illustrates scanning electron microscope images of (a) graphene prepared by spray deposition in Comparative Example 3, and (b) graphene prepared by CVD in Comparative Example 6.

FIG. 10 illustrates scanning electron microscope images of (a) the graphene prepared by spray deposition in Comparative Example 3, and (b) the graphene prepared by CVD in Comparative Example 6. Referring to FIG. 10, it may be understood that the graphene prepared by CVD in Comparative Example 6 had a very smooth surface and the graphene prepared by spay deposition in Comparative Example 3 also had a flat surface.

<Experimental Example 2> Analysis of Optical and Electrical Properties of Three-Dimensional Graphene Transparent Electrode In order to investigate the applicability of the transparent electrodes prepared in the examples and comparative examples as an electrode, optical transmittance and surface conductivity were measured. The optical transmittance was measured at 550 nm using a UV-vis spectroscope (UV-2400, Shimadzu, Japan), and the surface conductivity was measured using a four-point probe (FPP-RS8, Dasol Eng., Korea). The results obtained are presented in Table 1 below.

TABLE 1

|  | Transmittance (%, 550 nm) | Resistance ($\Omega/cm^2$) |
| --- | --- | --- |
| Example 1 | 92.3 | 1,100 |
| Example 2 | 89.9 | 770 |
| Example 3 | 82.0 | 330 |
| Comparative Example 1 | 87.6 | 990 |
| Comparative Example 2 | 84.1 | 760 |
| Comparative Example 3 | 83.4 | 640 |
| Comparative Example 4 | 92.6 | 10,600 |
| Comparative Example 5 | 92.8 | 5,400 |
| Comparative Example 6 | 81.0 | 1,300 |

Referring to Table 1, it may be understood that the transparent electrodes of Examples 1 to 3 according to the present invention had a transmittance of 80% or more even in the case in which graphene and PEDOT were used together.

In contrast, in the case that graphene was used alone, the transmittance was low and the transmittance was more improved in comparison to the sheet resistance when the spray deposition was used rather than the CVD method.

Also, with respect to the electrical conductivity, a lower resistance value was obtained when graphene and PEDOT were used together in comparison to the case in which graphene and PEDOT were each independently used.

INDUSTRIAL APPLICABILITY

A three-dimensional graphene transparent electrode prepared according to the present invention may be used in various electrical and electronics sectors.

The invention claimed is:

1. A method of preparing a three-dimensional graphene transparent electrode, the method comprising:
respectively preparing a substrate, a conductive polymer solution, and a graphene solution;
spraying the conductive polymer solution and the graphene solution on the substrate by an electrospray process using an electrospray apparatus; and
drying,
wherein the electrospray apparatus comprises:
syringes each including a nozzle, in which the conductive polymer solution and the graphene solution are stored for electrospraying;
syringe pumps for supplying the conductive polymer solution and the graphene solution to the syringes;
potential generators for forming electric fields between the substrate and the syringes; and
a stage for supporting the substrate on which the conductive polymer solution and the graphene solution are deposited.

2. The method of claim 1, wherein graphene formed on the substrate is arranged perpendicular to the substrate.

3. The method of claim 1, wherein the substrate comprises one selected form the group consisting of single silicon, p-Si (silicon), alkaline silicate-based glass, alkali-free glass, quartz glass, a silicon substrate, acrylate, polycarbonate, polyethylene naphthalate (PEN), polyethylene terephthalate (PET), polyamide, and a combination thereof.

4. The method of claim 1, wherein the conductive polymer solution comprises one selected form the group consisting of polyaniline, polypyrrole, polyacetylene, polythiophene, poly(3,4-ethylenedioxythiophene) (PEDOT), and a combination thereof.

5. The method of claim 1, wherein a concentration of the conductive polymer solution is in a range of 0.001 g/mL to 1.0 g/mL, and a concentration of the graphene solution is in a range of 0.001 g/mL to 0.1 g/mL.

6. The method of claim 1, wherein a weight ratio of graphene:conductive polymer is in a range of 1:0.1 to 1:50 during the electrospray process.

7. The method of claim 1, wherein the conductive polymer solution or the graphene solution uses one selected from the group consisting of water, methanol, ethanol, propanol, isopropanol, butanol, ethyl acetate, butyl acetate, diethylene glycol dimethyl ether, diethylene glycol dimethyl ethyl ether, methyl methoxypropionate, ethyl ethoxypropionate (EEP), ethyl lactate, propylene glycol methyl ether acetate (PGMEA), propylene glycol methyl ether, propylene glycol propyl ether, methyl cellosolve acetate, ethyl cellosolve acetate, diethylene glycol methyl acetate, diethylene glycol ethyl acetate, acetone, methyl ethyl ketone, methyl isobutyl ketone, cyclohexanone, dimethylformamide (DMF), N,N-dimethylacetamide (DMAc), N-methyl-2-pyrrolidone (NMP), γ-butyrolactone, diethyl ether, ethylene glycol dimethyl ether, diglyme, tetrahydrofuran (THF), methyl cellosolve, ethyl cellosolve, diethyl ether, diethylene glycol methyl ether, diethylene glycol ethyl ether, dipropylene glycol methyl ether, toluene, xylene, hexane, heptane, octane, and a mixture thereof, as a solvent.

8. The method of claim 1, wherein the conductive polymer solution or the graphene solution further comprises one additive selected from the group consisting of a dispersant, a surfactant, a plasticizer, a thickener, a diluent, and a combination thereof.

9. The method of claim 1, wherein the electrospray process of the conductive polymer solution and the graphene solution in a form of a separate or mixed solution is performed by a simultaneous injection, separate injection, or gradient injection process.

10. The method of claim 1, wherein the nozzle is disposed to be spaced apart from the substrate at a distance of 1 cm to 15 cm.

11. The method of claim 1, wherein the electric fields are a voltage of 5 kV to 50 kV during the electrospray process.

12. The method of claim 1, wherein the nozzle of the electro spray apparatus is disposed perpendicular to the substrate.

13. The method of claim 1, wherein the syringe nozzle of the electrospray apparatus is disposed parallel to a direction of gravity.

14. The method of claim 1, wherein the electrospraying is performed by a roll-to-roll process.

15. The method of claim 1, wherein the graphene transparent electrode has a transmittance of 80% or more and a sheet resistance of 1,100 $\Omega/cm^2$ or less.

* * * * *